United States Patent [19]

Huang et al.

[11] Patent Number: 5,140,386
[45] Date of Patent: Aug. 18, 1992

[54] HIGH ELECTRON MOBILITY TRANSISTOR

[75] Inventors: John C. Huang, Cambridge; Gordon S. Jackson, Belmont, both of Mass.

[73] Assignee: Raytheon Company, Lexington, Mass.

[21] Appl. No.: 697,830

[22] Filed: May 9, 1991

[51] Int. Cl.⁵ .......................................... H01L 29/80
[52] U.S. Cl. ........................................ 357/22; 357/16
[58] Field of Search ................ 357/16, 22 A, 22 MD

[56] References Cited

U.S. PATENT DOCUMENTS

| | | | |
|---|---|---|---|
| 4,600,932 | 7/1986 | Norris | 357/22 A |
| 4,652,896 | 3/1987 | Das et al. | 357/22 A |
| 4,821,093 | 4/1989 | Iafrate et al. | 357/22 A |
| 4,916,498 | 4/1990 | Berenz | 357/22 A |
| 5,008,717 | 4/1991 | Bar-Joseph et al. | 357/22 A |

FOREIGN PATENT DOCUMENTS

| | | | |
|---|---|---|---|
| 59-4085 | 1/1984 | Japan | 357/22 MD |
| 59-119768 | 7/1984 | Japan | 357/22 MD |
| 63-318165 | 12/1988 | Japan | 357/22 A |
| 1-94674 | 4/1989 | Japan | 357/22 A |
| 1-128473 | 5/1989 | Japan | 357/22 A |
| 1-199475 | 8/1989 | Japan | 357/22 A |

OTHER PUBLICATIONS

IEEE Electron Device Letters, vol. 10, No. 10, Oct. 1989, "A 0.25-μm Gate-Length Pseudomorphic HFET with 32-mW Output Power at 94 GHz", by Smith et al., pp. 437-439.

IEEE Electron Device Letters, vol. 11, No. 1, Jan. 1990, "W-Band Low-Noise In AlAs/InGaAs Lattice-Matched HEMT's", by Chao et al., pp. 59-62.

Primary Examiner—Rolf Hille
Assistant Examiner—Steven Loke
Attorney, Agent, or Firm—Denis G. Maloney; Richard M. Sharkansky

[57] ABSTRACT

A high electron mobility transistor includes a pair of charge screen layers disposed over a first one of active and charge donor layers of the high electron mobility transistor. The pair of screen layers are patterned to provide a double recessed channel. A first charge screen layer disposed adjacent to the charge donor layer is etched to provide a recess having a first length between source and drain electrodes, whereas a second charge screen layer disposed over the first aforementioned charge screen layer, as well as, a portion of the aforementioned first charge screen layer are etched to provide a second, substantially longer length between source and drain electrodes. The gate electrode is provided in the first aforementioned recess in Schottky barrier contact with the charge donor layer.

17 Claims, 2 Drawing Sheets

HIGH ELECTRON MOBILITY TRANSISTOR

BACKGROUND OF THE INVENTION

This invention relates generally to field effect transistors and, more particularly, to high electron mobility field effect transistors.

As is known in the art, there are several types of active devices used at microwave and millimeter wave frequencies to provide amplification of radio frequency signals. In general, one of the more common semiconductor devices used at these frequencies are field effect transistors, in particularly metal semiconductor field effect transistors (MESFETs) and high electron mobility transistors (HEMTs). Each of these transistors are provided from Group III-V materials such as gallium arsenide. What distinguishes a HEMT from a MESFET is that in a HEMT charge is transferred from a doped charge donor layer to an undoped channel layer whereas in a MESFET the charge layer and the channel layer are the same layer. Due to the presence of an undoped channel layer in a HEMT, charge transport properties of the undoped channel layer are better than those of the doped channel layer of a MESFET type structure. Accordingly, HEMTs provide higher frequency operation than MESFETs.

In a HEMT, the charge donor layer is generally a wide bandgap material, such as aluminum gallium arsenide whereas the channel layer is a lower bandgap material, such as gallium arsenide or indium gallium arsenide. It is to be noted that bandgap refers to the potential gap between valance and conduction bands of the semiconductor materials.

In general, there are two types of HEMT structures. One type is simply referred to as a HEMT, whereas the other type is referred to as a pseudomorphic HEMT. The difference between the HEMT and the pseudomorphic HEMT is that in the pseudomorphic HEMT one or more of the layers incorporated into the HEMT structure is comprised of a material having a lattice constant which differs significantly from the lattice constants of the other materials of the device. Thus, due to resulting lattice constant mismatch, the crystal structure of the material providing the channel layer is strained.

In a HEMT structure, charge is transferred from the donor layer to an undoped channel layer. For Group III-V materials, a doped charge donor layer is comprised of a wide bandgap material, such as gallium aluminum arsenide, whereas the channel layer is typically comprised of a material having better electron transport properties. Typically, a lower bandgap material, such as gallium arsenide is used. In a pseudomorphic HEMT, the undoped gallium arsenide channel layer is replaced by a channel layer comprised of a lower bandgap material, such as indium gallium arsenide. In either event, however, each of the HEMT and pseudomorphic HEMT structures are used to provide amplification of high frequency microwave and millimeter wave signals.

For low noise and high frequency applications of high electron mobility transistors, it is important to have a narrow recess disposed through the contact layers of the device and over the charge donor layer. That is, the recess opening is preferably only slightly longer than the gate length of the gate electrode disposed within the recess. This arrangement has provided HEMTs and pseudomorphic HEMTs that have relatively high frequency operating characteristics and relatively low noise figures. For power applications in MESFETs, it is generally known that a recessed opening larger than the gate is necessary to provide the MESFET having relatively high gate to drain breakdown voltage characteristics.

Returning to a HEMT, on the etched gallium aluminum arsenide surface which is generally the upper surface in most HEMT structures, there exists a large number of surface states. Such surface states also exist on the GaAs surface. Some authors have estimated the surface states to be as many as $10^{14}$ cm$^{-2}$. These states most likely arise from gallium and aluminum oxides. It has been suggested that these states once occupied, increase the gate to drain breakdown voltage characteristic by capturing electrons and thus decreasing the electric field concentrated at the gate metal edge on the drain side of the transistor.

The breakdown voltage characteristics of high electron mobility transistors has limited their use to relatively low power, low noise applications. This follows since the output impedance of a HEMT is generally related to the drain bias level. Low breakdown voltage characteristics limits the operating drain voltage of a HEMT. For a given DC power level, it is general advantageous to bias a HEMT for high power applications at relatively high drain voltages and low drain current rather than vice versa. Biased at high drain voltage provides a higher output impedance for the HEMT and therefore a more easy impedance match to a 50 ohm system characteristic impedance which is generally encountered in most applications. In particular, this match is more easily made over broad ranges of operating frequencies. Further, to provide high levels of RF voltage gain from such a device it is generally necessary to operate the device at a relatively high drain voltage DC bias. However, as indicated above, although it would be desirable to bias HEMTs at higher breakdown voltage, such is generally not possible since the HEMTs have relatively low breakdown voltage characteristics.

Therefore, high electron mobility transistors are used in relatively low power, low noise, applications, because the known high electron mobility transistors generally have relatively low gate to drain reverse breakdown voltage characteristics. This situation is undesirable since the high frequency characteristics of HEMTs and the relatively high gain of HEMTs in comparison to MESFETs, would otherwise be useful for higher power applications.

SUMMARY OF THE INVENTION

In accordance with the present invention, a high electron mobility transistor includes a charge donor layer comprised of a first Group III-V material and a channel layer disposed adjacent to said charge donor layer and comprised of a second Group III-V material having a bandgap energy lower than the bandgap energy of said first Group III-V material. The high electron mobility transistor further includes a pair of ohmic contacts disposed over a first one of said charge donor and channel layers and a Schottky barrier contact disposed on a second one of said charge donor and channel layers. The high electron mobility transistor further includes means for shielding or screening the channel layer from surface charges present in the region between the gate and drain electrodes of the high electron mobility transistor. With such an arrangement, by providing a shield to screen the channel layer from surface charge, the parasitic effects associated with surface charges in the gate to drain region of the transistor are reduced thereby permitting higher breakdown voltage characteristics from the high electron mobility transistor without degrading the RF performance characteristics of the HEMT.

We believe that breakdown voltage limitations in high electron mobility transistors are at least partially related to surface states or excess surface charge present in the charge donor layer or channel layer of the transistor. These surface states are the same surface states generally believed to alleviate the high electric field between the gate metal edge and the charge donor layer on the drain side of the device. Electrons can spatially tunnel from the metal gates to the nearby surface states in the semiconductor layers, such as the charged donor layer. However, as the gate to drain voltage increases, those surface states which are spatially removed from the gate electrode also become ionized. These trapped electrons thus provide a depletion region which is generally commensurate with the density of the surface states. The re-emission of these trapped charges requires a finite transit time which is generally much greater than the transit time of charge response under the gate electrode. Thus, the depletion region is essentially static relative to the input RF signal and as the RF signal increases in frequency the effects become more pronounced. Thus, the presence of the surface charges provide, in essence, a parasitic gate. The parasitic gate electrode thus acts as a slow gate which does not respond to high frequency signals as does the regular gate electrode of the HEMT. Accordingly, the presence of this gate electrode reduces the overall efficiency of the transistor. Further, we have also observed that the RF characteristics of a transistor can vary dramatically with quiescent bias voltages if surface states are present. The greater the drain gate voltage the more surface states are filled and the greater the large signal degradation that is provided.

In accordance with a further aspect of the present invention, the high electron mobility transistor further includes the charge donor layer comprised of the high bandgap Group III-V material with said charge donor layer having a sheet of dopant disposed substantially close to the interface provided by the charge donor layer and the channel layer. The dopant sheet has a concentration of dopant atoms confined to a few atomic layer thicknesses of the layer of material. With this particular arrangement, by providing the dopant sheet, the dopant has been removed from the vicinity of the gate electrode which results in a reduction of avalanche breakdown effects between the gate and drain regions of the high electron mobility transistor.

In accordance with a further aspect of the present invention, the shielding means is a pair of charge screen layers comprised of relatively lightly doped materials disposed between the gate electrode and source and drain electrodes of the high electron mobility transistor. With such an arrangement, by providing charge screen layers disposed between gate and source and drain electrodes, each of the charge screen layers supply positive space charge that compensate for the negative surface states present in the active layer.

In accordance with a still further aspect of the present invention, the high electron mobility transistor further includes a pair of charge screen layers disposed over the first one of active and charge donor layers of the high electron mobility transistor. The pair of screen layers are patterned to provide a double recessed channel. A first charge screen layer disposed adjacent to the charge donor layer is etched to provide a recess having a first length between source and drain electrodes, whereas a second charge screen layer disposed over the first aforementioned charge screen layer, as well as, a portion of the aforementioned first charge screen layer are etched to provide a second, substantially longer length between source and drain electrodes. The gate electrode is provided in the first aforementioned recess in Schottky barrier contact with the charge donor layer. With this particular arrangement, by providing a double recessed structure, the structure reduces the effect of surface states between the gate electrode and the active layer of the high electron mobility transistor by further removing such regions having such states from the immediate vicinity of the gate. This arrangement thus provides HEMTs having relatively high gate-drain breakdown voltage characteristics. Further, however, the presence of the lightly doped charge screen layers permits the above device to exhibit good breakdown voltage levels at relatively high frequencies.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1A:
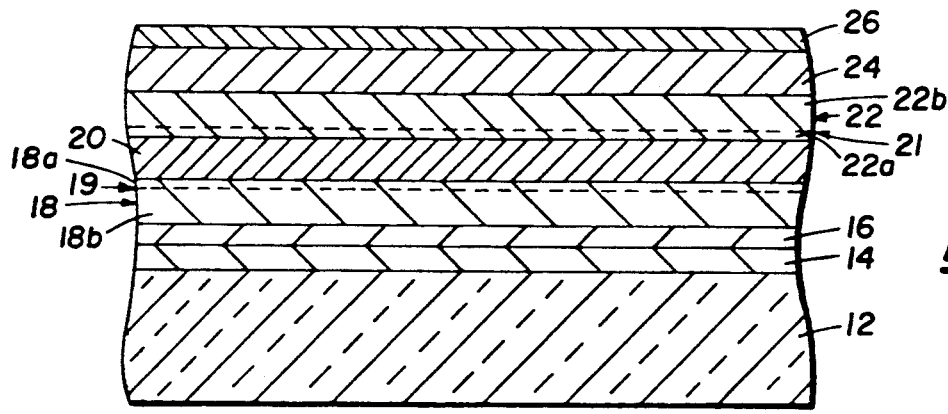
FIGS. 1A-1E are a series of cross-sectional views showing the steps in fabricating a high electron mobility transistor in accordance with the one aspect of the present invention.

Referring now to FIG. 1A, a substrate 12, here comprised of semi-insulating gallium arsenide or other suitable semiconductor material is shown having a plurality of layers disposed thereon. In particular, disposed over substrate 12 is a first layer 14, comprised of a superlattice buffer layer comprised of alternating layer pairs (not shown) of gallium arsenide and aluminum gallium arsenide, each one of said layers having a typical thickness of 50–100 Å disposed to provide a superlattice as is known in the art. Disposed over superlattice 14 is a undoped layer 16 of, here, gallium arsenide. Disposed over layer 16 is a back layer 18 comprised of aluminum gallium arsenide which provides a large bandgap material on the back or bottom surface of a channel layer 20, as will be described shortly. Back layer 18 has a pair of regions 18$a$, 18$b$. Region 18$a$ is a first region or spacer layer region of generally undoped wide bandgap material such as Al$_x$Ga$_{1-x}$As where X is typically between 0.1 and 0.3, whereas region 18$b$ is a second region of undoped, wide bandgap material here also AlGaAs. Such regions 18$a$, 18$b$ have disposed therebetween a region of high dopant concentration 19, here commonly referred to as an n type dopant spike and which is preferably described as a substantially two-dimensional layer or sheet of dopant material having a dopant concentration in the typical range of $0.3 \times 10^{12}$ to $5 \times 10^{12}$ a/cm$^2$ with the range of $0.3 \times 10^{12}$ to $1.5 \times 10^{12}$ being preferred. Further, the dopant layer 19 is confined to several angstroms of thickness of composite layer 18 thus to provide a sheet having a thickness of a few atomic layers. Dopant layer 19 is spaced some 30-50 Å by region 18a from the interface or heterojunction between region 18a and a layer 20 which provides the channel layer for the device to be fabricated. The channel layer 20 is comprised of a lower bandgap material, such as gallium arsenide or indium gallium arsenide or other suitable materials as is known. Layer 20 is undoped and provides a region of low impurity concentration and thus provides a region where carrier mobilities are relatively high.

Disposed over channel layer 20 is a second wide bandgap material layer 22, having an undoped spacer region 22a having a typical thickness of 30 Å to 50 Å and a lightly doped screening region 22b which are separated by an n type dopant spike region 21, having a sheet doping concentration of typically $2 \times 10^{12}$ to $5 \times 10^{12}$ a/cm$^2$ and provides the charge donor region for the channel layer 20. Region 22b is lightly doped having a dopant concentration in the range of $1 \times 10^{17}$ to $5 \times 10^{17}$ a/cm$^3$ typically and a thickness typically of 200 Å to 400 Å and provides a first charge screen layer, as will be further described. Disposed over region 22b is a second charge screen layer 24 here comprised of a medium bandgap material such as gallium arsenide (GaAs) having a dopant concentration of $1 \times 10^{17}$ to $5 \times 10^{17}$ a/cm$^3$. Layer 24 has a thickness typically in the range of 300 Å to 400 Å. Of course, for both layers 22 and 24 other thicknesses could be used. Disposed over layer 24 is a contact layer 26 comprised of a relatively highly doped layer (i.e. having a dopant concentration generally greater than $1 \times 10^{18}$ a/cm$^3$ or greater) of a Group III-V material such as gallium arsenide which is used to provide ohmic contact to source and drain electrodes, as will be described below.

Figure 1B:
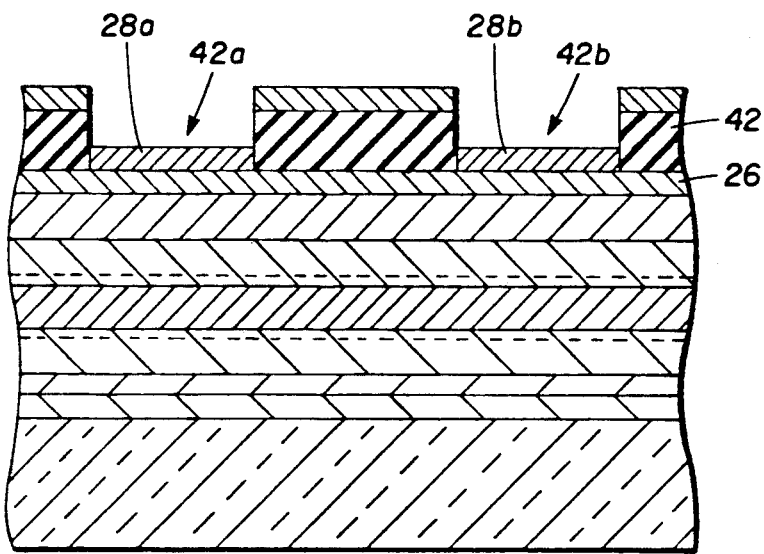

Referring now to FIG. 1B, layer 26 has disposed thereover a patterned photoresist layer 42 which defines regions for source and drain contacts. Layer 42 is patterned to provide regions or apertures 42a, 42b, as shown, and a layer of metal is introduced into apertures 42a, 42b and over portions of photoresist 42. Thereafter, the photoresist layer 42 is removed leaving behind electrodes 28a, 28b in the regions of apertures 42a, 42b, as shown. Such electrodes provide ohmic source and drain contacts to layer 26. Preferably the electrodes 28a, 28b are alloyed with layer 26 using techniques conventionally known to provide low resistivity ohmic type contacts to layer 26 and layers there below including underlying portion of the channel layer 20.

Figure 1C:
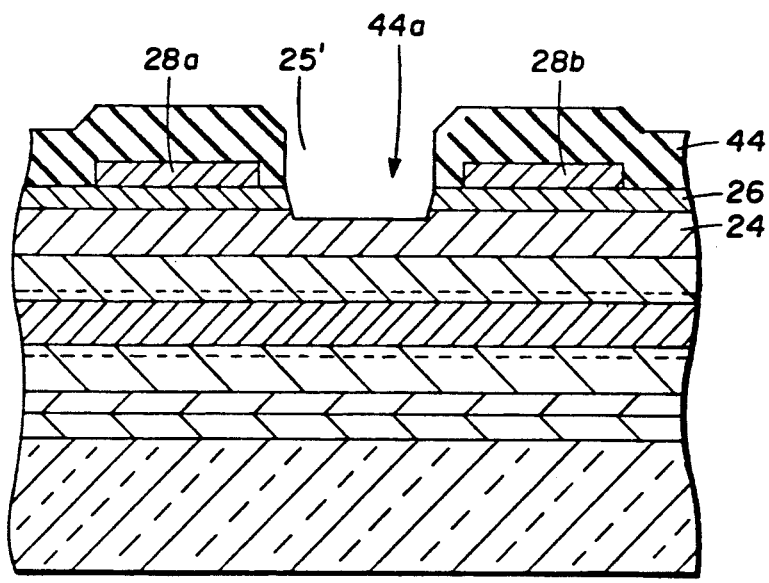

Referring now to FIG. 1C, photoresist layer 42 (FIG. 1B) having been removed leaves behind source and drain contacts 28a, 28b, respectively as shown. A second photoresist layer 44 is deposited over and is patterned to provide an aperture 44a which, here, is patterned to provide a relatively wide aperture between source and drain contacts 28a, 28b, as shown. The structure 10 is brought in to contact with an etchant which will suitably etch away exposed portions of layer 26, as well as, the selective portion of underlying layer 24, as shown. This provides a first recess through layers 26 and 24, as shown, for eventual formation of a gate electrode as will be described in conjunction with FIG. 1E. A suitable etchant for layers 26 and 24 is a dilute solution of ammonia hydroxide and hydrogen peroxide which is held in contact with said layers for a selected period of time.

Figure 1D:
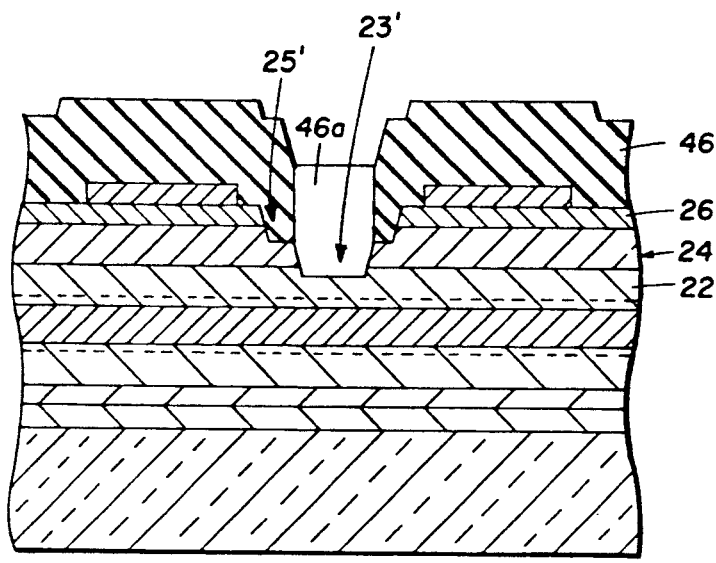

Referring now to FIG. 1D, photoresist layer 44 (FIG. 1C) is removed and is replaced with a third photoresist layer 46 which is likewise patterned to, here, provide an aperture 46a in photoresist layer 46 generally disposed within the recess portion 25' of the layers 24 and 26. Aperture 46a exposes a selective underlying portion of layer 24. An etchant such as a dilute solution of ammonia hydroxide and hydrogen peroxide is brought into contact with the exposed portion of layer 24 to form a recess 23 within the aforementioned recess portion 25'. Here recess 23 is provided through layer 24 and through a selected portion of layer 22. This mask is also used to deposit a Schottky barrier metal (not shown) to provide a gate electrode in Schottky barrier contact with layer 22 as generally shown in FIG. 1E.

Figure 1E:
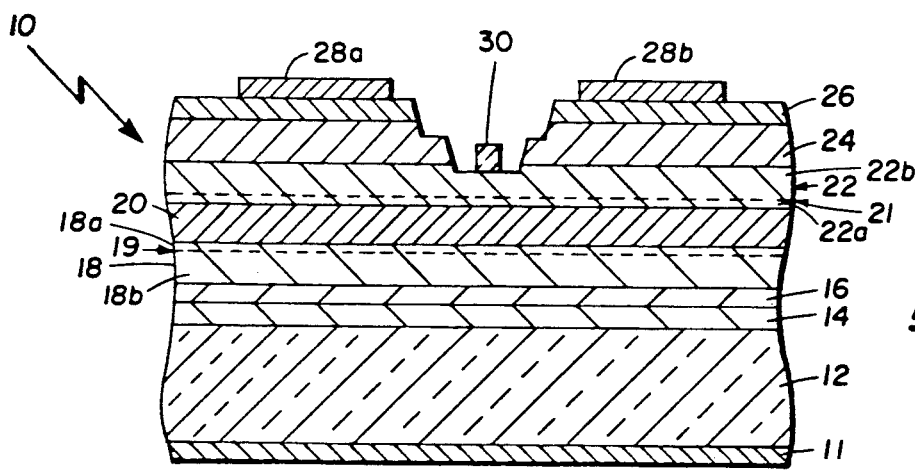

The structure 10 shown in FIG. 1E includes a pair of charge donor layers 18, 22, disposed over and under channel layer 20. This is a so-called high breakdown high electron mobility transistor structure. Further, the structure described in conjunction with FIG. 1E includes a pair of charge screening layers 22b, 24 disposed between the contact layer 26 and the dopant spike or charge donor region 21. Here region 22b differs from the conventional charge donor layer of a typical high electron mobility transistor since it has a generally low dopant concentration except for the dopant spike region 21 disposed substantially adjacent the heterojunction provided between layers 20 and 22. The heterojunction is formed in said layers by disposing the spacer region of the wide bandgap material, such as aluminum gallium arsenide characteristic of spacer region 22a with the lower bandgap material, such as gallium arsenide or indium gallium arsenide used for layer 20.

With this arrangement of the layer 22, a substantial portion of the charge is removed from the vicinity of the gate electrode 30 which is accomplished by the relatively low dopant concentration throughout most of the layer 22 except for the dopant spike regions 21.

The presence of the double wide recessed gate electrode in the pair of charge screen regions or layers 22b, 24 serves to further reduce the influence of surface states or a resulting surface inversion layer which exists on the surface of the semiconductor regions disposed between the gate electrode 30 and drain electrode 28b from providing parasitic gate effects in the channel layer 20. Furthermore, the lightly doped charge screen layers 22b and 24 further reduces the effect of surface states between the gate electrode and the channel layer 20. With each of the aforementioned arrangements therefore since the parasitic effects between the gate electrode and the channel layer are reduced, the resulting high electron mobility transistor can be operated at substantially higher drain bias voltage than conventionally known HEMTs.

As also shown in conjunction with FIG. 1E, a ground plane conductor 11 is disposed over an opposing surface of substrate 12, as is conventionally provided.

Figure 2:
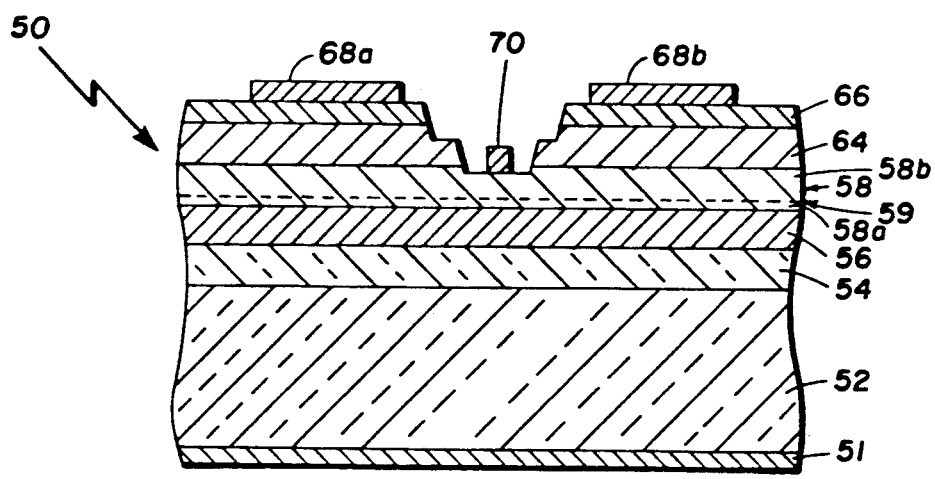
FIG. 2 is a cross-sectional view showing a high electron mobility transistor in accordance with a further aspect of the present invention.

Referring now to FIG. 2, a high electron mobility transistor 50 having a single charge donor layer and having the structure as otherwise generally described in conjunction with FIG. 1 is shown. Here the transistor is fabricated using similar approaches generally described above. Thus, here the transistor 50 includes a substrate 52 having a ground plane 51 disposed over the first surface thereof and a buffer layer 54, here a superlattice type buffer layer, disposed over a second surface of substrate 52. Disposed over the superlattice buffer layer 54 is a channel layer 56 comprised of a relatively low or narrow bandgap material such as gallium arsenide or indium gallium arsenide. Disposed over channel layer 56 is a charge donor layer 58 comprised of a dopant spike region 59 having the general characteristics as discussed above in conjunction with FIG. 1E for regions 19 and 21. That is, dopant region 59 is generally characterized as a sheet or two-dimensional layer of dopant material having a dopant concentration of $2 \times 10^{12}$ to $5 \times 10^{12}$ a/cm$^2$. Dopant region 59 is spaced from channel layer 56 by a spacer layer 58a (30 Å to 50 Å in thickness) of undoped wide bandgap material such as gallium aluminum arsenide. The remainder of layer 58, here region 58b (i.e. typically 200 Å to 400 Å), is, again, lightly doped gallium aluminum arsenide. Disposed over region 58b of layer 58 is a layer 64 comprised of lightly doped N-type gallium arsenide as for layer 24. Disposed over layer 64 is a relatively heavy doped layer of N-type gallium arsenide to provide a contact with source and drain electrodes as shown. Gate electrode 70 is disposed in a double recessed portion of layers 66 and 64, as also shown, and as generally described above in conjunction with FIG. 1E. The structure shown in FIG. 2 is a high electron mobility transistor having a single charge donor layer. The presence of the double wide recess, the dopant spike region 59, and the pair of charge screen regions or layers 58b and 64 provide individually and collectively improvements in breakdown voltage characteristics as generally described for the structure shown in FIG. 1E.

Such structures could alternatively be used with so-called inverted high electron mobility transistors which have a charge donor layer under rather than over the channel layer as generally described above.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A transistor comprises:
   a charge donor layer comprised of a first Group III–V material;
   a channel layer disposed adjacent said charge donor layer and comprised of a second Group III–V material having a bandgap energy lower than the bandgap energy of said first Group III–V material;
   a pair of ohmic contacts disposed over first portions of said charge donor and channel layers and a Schottky barrier contact disposed over second portions of said charge donor and channel layers; and
   means for shielding at least one of said charge donor and channel layers from the effects of surface charges which are present in regions between gate and drain electrodes of the transistor, said means further comprising:
   a first charge screen layer corresponding to a portion of said charge donor layer; and
   a second charge screen layer comprised of a third Group III-material having a bandgap energy lower than the bandgap energy of said first Group III–V material disposed adjacent said gate electrode and at least one drain and source electrodes of said transistor.

2. The transistor, as recited in claim 1, wherein said charge donor layer has a first portion adjacent said channel being of an undoped Group III–V material, an intermediate portion adjacent said undoped portion comprised of a dopant sheet of N-type dopant having a concentration of dopant atoms confined to a few atomic layer thicknesses of the charge donor layer and a third portion of said layer being a relatively lightly doped region of said charge donor layer with said third portion corresponding to the first charge screen layer.

3. The transistor, as recited in claim 2, wherein said second charge screen layer comprised of relatively lightly doped Group III–V material has a dopant concentration of $1 \times 10^{17}$ to $5 \times 10^{17}$ atoms/cc in a region thereof disposed adjacent the gate electrode, and source and drain electrodes of the transistor.

4. The transistor, as recited in claim 3, wherein said first charge screen layer has a first recess having a first width disposed therethrough and a second recess aligned over the first recess having a second, substantially larger width than that of the first recess disposed through a portion of the thickness of the second charge screen layer.

5. The transistor, as recited in claim 1, wherein said charge donor layer is comprised of aluminum gallium arsenide and said channel layer is comprised of gallium arsenide.

6. The structure, as recited in claim 1, wherein said first material is aluminum gallium arsenide, said second material is indium gallium arsenide, and said third material is gallium arsenide.

7. The transistor, as recited in claim 1, wherein said charge donor layer is a first charge donor layer and said transistor further comprises a second charge donor layer comprised of said first Group III–V material disposed on an opposing surface of said channel layer such that said first charge donor layer and said second charge donor layer are disposed to sandwich said channel layer.

8. The transistor, as recited in claim 7, wherein said second charge donor layer comprises:
   a first portion adjacent said channel layer being of an undoped first Group III–V material, an intermediate portion of said charge donor layer adjacent said undoped portion comprised of a dopant sheet of n-type dopant having a concentration of dopant atoms confined to a few atomic layer thicknesses of the second charge donor layer and a third portion of said second charge donor layer disposed adjacent said dopant sheet being an undoped region of said first Group III–V material.

9. The transistor, as recited in claim 8, wherein said first charge donor layer has a first portion adjacent said channel being of an undoped first Group III–V material, an intermediate portion of said charge donor layer adjacent said undoped portion comprised of a dopant sheet of n-type dopant having a concentration of dopant atoms confined to a few atomic layer thicknesses of the first charge donor layer, and a third portion of said first charge donor layer being a relatively lightly doped region of said first charge donor layer with said third portion corresponding to the first charge screen layer.

10. The transistor, as recited in claim 7, wherein said second charge screen layer is comprised of doped third Group III–V material disposed adjacent the gate electrode and source and drain electrodes of the high electron mobility transistor and having a dopant concentration in the range of about $1 \times 10^{17}$ to $5 \times 10^{17}$ atoms/cc.

11. The transistor, as recited in claim 10, wherein said first charge screen layer has a first recess having a first width disposed therethrough and a second recess aligned over the first recess having a second, substantially larger width than that of the first recess and disposed through a portion of the thickness of the second charge screen layer.

12. The transistor, as recited in claim 11, further comprising a pair of spaced contact regions comprised of said third Group III-V material having a dopant concentration greater than about $1 \times 10^{18}$ atoms per square centimeter disposed between said corresponding pair of source and drain electrodes and said charge screen layer.

13. A high electron mobility transistor comprises:
   a semi-insulating substrate;
   a channel layer comprised of a first Group III-V material disposed over said semi-insulating substrate;
   a charge donor layer disposed over said channel layer and comprised of a second Group III-V material having a bandgap higher than that of the corresponding bandgap of the material of the channel layer, a first region of said second Group III-V material being undoped, a second region of said charge donor layer having a dopant confined to a few angstroms thickness of said charge donor layer and having a dopant concentration generally in the range of about $2.0 \times 10^{12}$ to $5 \times 10^{12}$ atoms per square centimeter, and a third region comprised of a relatively lightly doped portion of said second Group III-V material;
   a charge screen layer comprised of a lightly doped N-type region of a first Group III-V material disposed over said third region of said charge donor layer;
   a pair of spaced contact regions comprised of said first Group III-V material having a dopant concentration greater than about $1 \times 10^{18}$ atoms per cubic centimeter disposed over said charge screen layer;
   a gate electrode disposed in Schottky barrier contact with said third region of said charge donor layer; and
   a pair of source and drain electrodes disposed in ohmic contact with said spaced contact regions.

14. The transistor, as recited in claim 13, wherein said third region of said charge donor layer and a selective portion of said charge screen layer has a first aperture and wherein said charge screen layer and spaced contact regions have therein a second relatively wide aperture compared to that of the first aperture and said second aperture disposed in alignment over the first aperture and said gate is disposed in said first aperture.

15. A high electron mobility transistor comprising:
   a substrate;
   a channel layer comprised of a first Group III-V material disposed over said substrate;
   a charge donor layer disposed over said channel layer comprised of:
      a first region of undoped second Group III-V material having a bandgap higher than the corresponding bandgap of the material of the channel layer;
      a second region of said charge donor layer having a dopant confined to a few angstroms thickness of said charge donor layer and having a dopant concentration in the range of about $\times 10^{12}$ to $5 \times 10^{12}$ atoms per square centimeter; and
      a third region comprised of a relatively lightly doped portion of said second Group III-V material compared to the dopant concentration of said second region;
   a charge screen layer comprised of a third Group III-V material disposed over said third region of said charge donor layer with said charge screen layer having a portion of lightly doped n-type material;
   a gate electrode disposed in Schottky barrier contact with said third region of said charge donor layer in a region of said charge donor layer underlying the portion of said charge screen layer which is lightly doped n-type; and
   a pair of source and drain electrodes disposed in ohmic contact over said charge screen layer.

16. The structure, as recited in claim 15, wherein said charge donor layer is comprised of aluminum gallium arsenide and said channel layer is comprised of gallium arsenide.

17. The structure, as recited in claim 15, wherein said first material is indium gallium arsenide, said second material is aluminum gallium arsenide, and said third material is gallium arsenide.

* * * * *

UNITED STATES PATENT AND TRADEMARK OFFICE
CERTIFICATE OF CORRECTION

PATENT NO. : 5,140,386  
APPLICATION NO. : 07/697830  
DATED : August 18, 1992  
INVENTOR(S) : Huang et al.

Page 1 of 1

It is certified that error appears in the above-identified patent and that said Letters Patent is hereby corrected as shown below:

Column 7, line 60:  
Replace "III-material" with -- III-V material --.

Column 7, line 67:  
After "channel" insert -- layer --.

Column 10, line 19:  
After "about" insert -- 2 --.

Signed and Sealed this

Twenty Second Day of April, 2008

JON W. DUDAS  
*Director of the United States Patent and Trademark Office*

(12) EX PARTE REEXAMINATION CERTIFICATE (7685th)
United States Patent
Huang et al.

(10) Number: US 5,140,386 C1
(45) Certificate Issued: Aug. 17, 2010

(54) HIGH ELECTRON MOBILITY TRANSISTOR

(75) Inventors: John C. Huang, Cambridge, MA (US); Gordon S. Jackson, Belmont, MA (US)

(73) Assignee: Raytheon Company, Lexington, MA (US)

Reexamination Request:
No. 90/010,379, Feb. 13, 2009

Reexamination Certificate for:
Patent No.: 5,140,386
Issued: Aug. 18, 1992
Appl. No.: 07/697,830
Filed: May 9, 1991

Certificate of Correction issued Apr. 22, 2008.

(51) Int. Cl.
*H01L 29/778* (2006.01)
*H01L 29/08* (2006.01)
*H01L 29/66* (2006.01)
*H01L 29/02* (2006.01)

(52) U.S. Cl. .............. 257/194; 257/284; 257/E29.041; 257/E29.249

(58) Field of Classification Search .............. None
See application file for complete search history.

(56) References Cited

U.S. PATENT DOCUMENTS

| | | | | |
|---|---|---|---|---|
| 4,558,337 | A | 12/1985 | Saunier et al. | 357/22 |
| 4,600,932 | A | 7/1986 | Norris | 257/191 |
| 4,635,343 | A | 1/1987 | Kuroda | 438/172 |
| 4,652,896 | A | 3/1987 | Das et al. | 257/194 |
| 4,733,283 | A | 3/1988 | Kuroda | |
| 4,742,379 | A | 5/1988 | Yamashita et al. | 257/195 |
| 4,821,093 | A | 4/1989 | Iafrate et al. | 257/194 |
| 4,916,498 | A | 4/1990 | Berenz | 257/194 |
| 5,008,717 | A | 4/1991 | Bar-Joseph et al. | 359/321 |
| 5,043,777 | A | 8/1991 | Sriram | |
| 5,084,743 | A | 1/1992 | Mishra et al. | 257/487 |
| 5,548,139 | A * | 8/1996 | Ando | 257/192 |

FOREIGN PATENT DOCUMENTS

| | | |
|---|---|---|
| EP | 0 367 411 | 5/1990 |
| EP | 0 514 079 | 7/1998 |
| JP | 53 081 086 | 7/1978 |
| JP | 57 026 472 | 2/1982 |
| JP | 59-4085 | 1/1984 |
| JP | 59-119768 | 7/1984 |
| JP | 62130565 | 6/1987 |
| JP | 63-318165 | 12/1988 |
| JP | 1-94674 | 4/1989 |
| JP | 1-128473 | 5/1989 |
| JP | 1-199475 | 8/1989 |
| JP | 02-030149 | 1/1990 |

OTHER PUBLICATIONS

Wolf, et al. Silicon Processing for the VLSI Era, vol. 2—Process Integration, Lattice Press: Sunset Beach CA, 1990, pp. 87–90.*

Smith, et al., "A 0.25-μm Gate–Length Pseudomorphic HFET with 32–mW Output Power at 94 GHz", IEEE Electron Device Letters, vol. 10, No. 10, Oct. 1989, pp. 437–439.

Chao, et al., "W–Band Low–Noise in AlAs/InGaAs Lattice–Matched HEMT's", IEEE Electron Device Letters, vol. 11, No. 1, Jan. 1990, pp. 59–62.

(Continued)

*Primary Examiner*—Erik Kielin

(57) ABSTRACT

A high electron mobility transistor includes a pair of charge screen layers disposed over a first one of active and charge donor layers of the high electron mobility transistor. The pair of screen layers are patterned to provide a double recessed channel. A first charge screen layer disposed adjacent to the charge donor layer is etched to provide a recess having a first length between source and drain electrodes, whereas a second charge screen layer disposed over the first aforementioned charge screen layer, as well as, a portion of the aforementioned first charge screen layer are etched to provide a second, substantially longer length between source and drain electrodes. The gate electrode is provided in the first aforementioned recess in Schottky barrier contact with the charge donor layer.

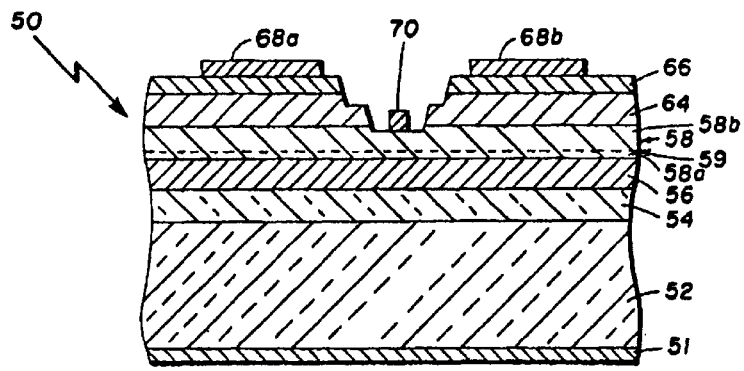

OTHER PUBLICATIONS

Itoh, et al., "Effect of InGaAs Well Width on Low–Noise Performance in AlGaAs/InGaAs Pseudomorphic HEMT", Japanese Journal of Applied Physics, Extended Abstracts of the $21^{st}$ Conference on Solid State Devices and Materials, Tokyo, 1989, pp. 285–288.

De La Houssaye, et al., "Electron Saturation Velocity Variation in InGaAs and GaAs Channel MODFET's for Gate Lengths to 550 Å", IEEE Electron Device Letters, vol. 9, No. 3, Mar. 1988, pp. 148–149.

Chao, et al., "DC and Microwave Characteristics of Sub–0.1–µm Gate–Length Planar–Doped Pseudomorphic HEMT's", IEEE Transactions On Electron Devices, vol. 36, No. 3, Mar. 1989, pp. 461–473.

Wang, et al., "An Analytical Model for I–V and Small–Signal Characteristics of Planar–Doped HEMT's", IEEE Transactions On Microwave Theory and Techniques, vol. 37, No. 9, Sep. 1989, pp. 1395–1400.

Huang, et al., "A High–Gain, Low–Noise, 1/2–µm Pulse–Doped Pseudomorphic HEMT", IEEE Electron Device Letters, vol. 10, No. 11, Nov. 1989, pp. 511–513.

Lester, et al., "O.15 µm Gate–Length Double Recess Pseudomorphic HEMT with Fmax OF 350 GHZ", IEEE, 1988, pp. 172–175.

Chen, et al., "Bias–Dependent Microwave Characteristics of Atomic Planar–Doped AlGaAs/InGaAs/GaAs Double Heterojunction MODFET's", IEEE Transactions On Microwave Theory and Techniques, vol. MTT–35, No. 12,Dec. 1987, pp. 1456–1460.

Liu, et al., "Design, Analysis Of High Electron Mobility Field Effect Transistors By A Self–Consistent Method", VLSI Technology, Systems and Applications, 1989. Proceedings of Technical Papers, 1989 International Symposium on, May 17–19, 1989, pp. 121–125.

Huang, et al., "An AlGaAs/InGaAs Pseudomorphic High Electron Mobility Transistor (PHEMT) For X– and Ku–band Power Applications", IEEE MTT–S Digest, 1991, pp. 713–716.

Hikosaka, et al., "A Microwave Power Double–Heterojunction High Electron Mobility Transistor", IEEE Electron Device Letters, vol. 6, No. 7, Jul. 1985, pp. 341–343.

Dingle, et al., "Electron mobilities in modulation–doped semiconductor heterojunction superlattices", American Institute of Physics, Appl. Phys. Lett. 33(7), Oct. 1, 1978, pp. 665–667.

P.C. Chao et al., "High Performance 0.1 µm Gate–Length Planar–Doped HEMTs," 87 IEDM 410 (1987).

Table II—"Semiconductor Properties of Selected Materials" on p. E–103 of the Handbook of Chemistry and Physics, 55th ed., Robert C. Weast, Ph.D., ed., CRC Press, Inc. (1974).

Stephen I. Long & Steven E. Butner, *Gallium Arsenide Digital Integrated Circuit Design*, New York: McGraw–Hill Publishing Company, p. 21 (1990).

B.L. Sharma, ed., *Metal–Semiconductor Junctions and Their Applications*, New York and London: Plenum Press, pp. 113–115 (1984).

Lawrence H. Van Vlack, *Elements of Materials Science and Engineering 6th ed.*, Reading MA: Addison–Wesley Publishing Company, p. 22 (1989).

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-7 are determined to be patentable as amended.

Claims 8-12, dependent on an amended claim, are determined to be patentable.

New Claims 18-22 are added and determined to be patentable.

Claims 13-17 were not reexamined.

1. A transistor comprises:
a charge donor layer comprised of a first Group III-V material;
a channel layer disposed adjacent said charge donor layer and comprised of a second Group III-V material having a bandgap energy lower than the bandgap energy of said first Group III-V material;
a pair of ohmic contacts disposed over first portions of said charge donor and channel layers and a Schottky barrier contact disposed over second portions of said charge donor and channel layers; and
means for shielding at least one of said charge donor and channel layers from the effects of surface charges which are present in regions between gate and drain electrodes of the transistor, said means further comprising:
a first charge screen layer corresponding to a portion of said charge donor layer; and
a second charge screen layer comprised of a third Group III-V material having a bandgap energy lower than the bandgap energy of said first Group III-V material disposed adjacent said gate electrode and at least one drain and source electrodes of said transistor,
*wherein each of the first and second charge screen layers are lightly doped with a dopant concentration in a range of $1 \times 10^{17}$ to $5 \times 10^{17}$ atoms/cc, and wherein the first and the second charge screen layers provide a double recessed structure, with a recessed portion of the second charge screen layer being wider than a recessed portion of the first charge screen Layer.*

2. [The transistor, as recited in claim 1,] *A transistor comprises:*
*a charge donor layer comprised of a first Group III-V material;*
*a channel layer disposed adjacent said charge donor layer and comprised of a second Group III-V material having a bandgap energy lower than the bandgap energy of said first Group III-material;*
*a pair of ohmic contacts disposed over first portions of said charge donor and channel layers and a Schottky barrier contact disposed over second portions of said charge donor and channel layers; and*
*means for shielding at least one of said charge donor and channel layers from the effects of surface charges which are present in regions between gate and drain electrodes of the transistor, said means further comprising:*
*a first charge screen layer corresponding to a portion of said charge donor layer; and*
*a second charge screen layer comprised of a third Group III-V material having a bandgap energy lower than the bandgap energy of said first Group III-V material disposed adjacent said gate electrode and at least one drain and source electrodes of said transistor,*
wherein said charge donor layer has a first portion adjacent said channel layer being of an undoped Group III-V material, an intermediate portion adjacent said undoped portion comprised of a dopant sheet of N-type dopant having a concentration of dopant atoms confined to a few atomic layer thicknesses of the charge donor layer and a third portion of said layer being a relatively lightly doped region of said charge donor layer with said third portion corresponding to the first charge screen layer.

3. [The transistor, as recited in claim 2,] *A transistor comprises:*
*a charge donor layer comprised of a first Group III-V material;*
*a channel layer disposed adjacent said charge donor layer and comprised of a second Group III-V material having a bandgap energy lower than the bandgap energy of said first Group III-V material;*
*a pair of ohmic contacts disposed over first portions of said charge donor and channel layers and a Schottky barrier contact disposed over second portions of said charge donor and channel layers; and*
*means for shielding at least one of said charge donor and channel layers from the effects of surface charges which are present in regions between gate and drain electrodes of the transistor, said means further comprising:*
*a first charge screen layer corresponding to a portion of said charge donor layer; and*
*a second charge screen layer comprised of a third Group III-V material having a bandgap energy lower than the bandgap energy of said first Group III-V material disposed adjacent said gate electrode and at least one drain and source electrodes of said transistor,*
*wherein said charge donor layer has a first portion adjacent said channel layer being of an undoped Group III-V material, an intermediate portion adjacent said undoped portion comprised of a dopant sheet of N-type dopant having a concentration of dopant atoms confined to a few atomic layer thicknesses of the charge donor layer and a third portion of said layer being a relatively lightly doped region of said charge donor layer with said third portion corresponding to the first charge screen layer, and*
wherein said second charge screen layer comprised of relatively lightly doped Group III-V material has a dopant concentration of $1 \times 10^{17}$ to $5 \times 10^{17}$ atoms/cc in a region thereof disposed adjacent the gate electrode, and source and drain electrodes of the transistor.

4. [The transistor, as recited in claim 3,] *A transistor comprises:*
*a charge donor layer comprised of a first Group III-V material;* a channel layer disposed adjacent said charge donor layer and comprised of a second Group III-V material having a bandgap energy lower than the bandgap energy of said first Group III-V material;

a pair of ohmic contacts disposed over first portions of said charge donor and channel layers and a Schottky barrier contact disposed over second portions of said charge donor and channel layers; and means for shielding at least one of said charge donor and channel layers from the effects of surface charges which are present in regions between gate and drain electrodes of the transistor, said means further comprising:

first charge screen layer corresponding to a portion of said charge donor layer; and a second charge screen layer comprised of a third Group III-V material having a bandgap energy lower than the bandgap energy of said first Group III-V material disposed adjacent said gate electrode and at least one drain and source electrodes of said transistor, wherein said charge donor layer has a first portion adjacent said channel layer being of an undoped Group III-V material, an intermediate portion adjacent said undoped portion comprised of a dopant sheet of N-type dopant having a concentration of dopant atoms confined to a few atomic layer thicknesses of the charge donor layer and a third portion of said layer being a relatively lightly doped region of said charge donor layer with said third portion corresponding to the first charge screen layer, and wherein said second charge screen layer comprised of relatively lightly doped Group III-V material has a dopant concentration of $1 \times 10^{17}$ to $5 \times 10^{17}$ atoms/cc in a region thereof disposed adjacent the gate electrode, and source and drain electrodes of the transistor, wherein said first charge screen layer has a first recess having a first width disposed therethrough and a second recess aligned over the first recess having a second, substantially larger width than that of the first recess disposed through a portion of the thickness of the second charge screen layer.

5. The transistor, as recited in claim [1] 2, wherein said charge donor layer is comprised of aluminum gallium arsenide and said channel layer is comprised of gallium arsenide.

6. The structure, as recited in claim [1] 2, wherein said first material is aluminum gallium arsenide, said second material is indium gallium arsenide, and said third material is gallium arsenide.

7. The transistor, as recited in claim [1] 2, wherein said charge donor layer is a first charge donor layer and said transistor further comprises a second charge donor layer comprised of said first Group III-V material disposed on an opposing surface of said channel layer such that said first charge donor layer and said second charge donor layer are disposed to sandwich said channel layer.

18. A transistor comprises:

a charge donor layer comprised of a first Group III-V material;

a channel layer disposed adjacent said charge donor layer and comprised of a second Group III-V material having a bandgap energy lower than the bandgap energy of said first Group III-V material;

a pair of ohmic contacts disposed over first portions of said charge donor and channel layers and a Schottky barrier contact disposed over second portions of said charge donor and channel layers; and means for shielding at least one of said charge donor and channel layers from the effects of surface charges which are present in regions between gate and drain electrodes of the transistor, said means further comprising:

a first charge screen layer corresponding to a portion of said charge donor layer; and a second charge screen layer comprised of a third Group III-V material having a bandgap energy lower than the bandgap energy of said first Group III-V material disposed adjacent said gate electrode and at least one drain and source electrodes of said transistor, wherein the charge donor layer includes a dopant sheet of N-type dopant having a concentration of dopant atoms confined to a few atomic layers in thickness.

19. A transistor comprises, a charge donor layer comprised of a first Group III-V material;

a channel layer disposed adjacent said charge donor layer and comprised of a second Group III-V material having a bandgap energy lower than the bandgap energy of said first Group III-V material;

a pair of ohmic contacts disposed over first portions of said charge donor and channel layers and a Schottky barrier contact disposed over second portions of said charge donor and channel layers; and means for shielding at least one of said charge donor and channel layers from the effects of surface charges which are present in regions between gate and drain electrodes of the transistor, said means further comprising:

a first charge screen layer corresponding to a portion of said charge donor layer; and a second charge screen layer comprised of a third Group III-V material having a bandgap energy lower than the bandgap energy of said first Group III-V material disposed adjacent said gate electrode and at least one drain and source electrodes of said transistor, wherein each of the first and the second charge screen layers is provided with lightly doped material that has a dopant concentration in a range of $1 \times 10^{17}$ $cm^{-3}$ to $5 \times 10^{17}$ $cm^{-3}$.

20. A transistor comprises:

a charge donor layer comprised of a first Group III-V material;

a channel layer disposed adjacent said charge donor layer and comprised of a second Group III-V material having a bandgap energy lower than the bandgap energy of said first Group III-V material;

a pair of ohmic contacts disposed over first portions of said charge donor and channel layers and a Schottky barrier contact disposed over second portions of said charge donor and channel layers; and means for shielding at least one of said charge donor and channel layers from the effects of surface charges which are present in regions between gate and drain electrodes of the transistor, said means further comprising:

a first charge screen layer corresponding to a portion of said charge donor layer; and a second charge screen layer comprised of a third Group III-V material having a bandgap energy lower than the bandgap energy of said first Group III-V material disposed adjacent said gate electrode and at least one drain and source electrodes of said transistor, wherein the first charge screen layer has a portion thereof containing dopant concentration in a range of $1 \times 10^{17}$ $cm^{-3}$ to $5 \times 10^{17}$ $cm^{-3}$.

21. A transistor comprises:

a charge donor layer comprised of a first Group III-V material;

a channel layer disposed adjacent said charge donor layer and comprised of a second Group III-V material having a bandgap energy lower than the bandgap energy of said first Group III-V material;

a pair of ohmic contacts disposed over first portions of said charge donor and channel layers and a Schottky barrier contact disposed over second portions of said charge donor and channel layers; and means for shielding at least one of said charge donor and channel layers from the effects of surface charges which are present in regions between gate and drain electrodes of the transistor, said means further comprising:

first charge screen layer corresponding to a portion of said charge donor layer; and a second charge screen layer comprised of a third Group III-V material having a bandgap energy lower than the bandgap energy of said first Group III-V material disposed adjacent said gate electrode and at least one drain and source electrodes of said transistor, wherein the second charge screen layer has a dopant concentration in a range of $1\times10^{17}$ $cm^{-3}$ to $5\times10^{17}$ $cm^{-3}$.

22. A transistor comprises:

a charge donor layer comprised of a first Group III-V material;

a channel layer disposed adjacent said charge donor layer and comprised of a second Group III-V material having a bandgap energy lower than the bandgap energy of said first Group III-V material;

a pair of ohmic contacts disposed over first portions of said charge donor and channel layers and a Schottky barrier contact disposed over second portions of said charge donor and channel layers; and means for shielding at least one of said charge donor and channel layers from the effects of surface charges which are present in regions between gate and drain electrodes of the transistor, said means further comprising:

a first charge screen layer corresponding to a portion of said charge donor layer; and a second charge screen layer comprised of a third Group III-V material having a bandgap energy lower than the bandgap energy of said first Group III-V material disposed adjacent said gate electrode and at least one drain and source electrodes of said transistor, wherein said first charge screen layer has a first recess having a first width disposed therethrough and a second recess aligned over the first recess having a second, substantially larger width than that of the first recess disposed through a portion of the thickness of the second charge screen layer.

* * * * *